(12) United States Patent
Zhang et al.

(10) Patent No.: US 12,066,345 B2
(45) Date of Patent: Aug. 20, 2024

(54) FORCE MEASUREMENT SYSTEM AND FORCE MEASUREMENT METHOD

(71) Applicant: CHANGXIN MEMORY TECHNOLOGIES, INC., Hefei (CN)

(72) Inventors: Zhengxian Zhang, Hefei (CN); Wei Pei, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/611,803

(22) PCT Filed: Jul. 20, 2021

(86) PCT No.: PCT/CN2021/107263
§ 371 (c)(1),
(2) Date: Nov. 16, 2021

(87) PCT Pub. No.: WO2022/116553
PCT Pub. Date: Jun. 9, 2022

(65) Prior Publication Data
US 2023/0304877 A1    Sep. 28, 2023

(30) Foreign Application Priority Data
Dec. 3, 2020    (CN) .......................... 202011410569.7

(51) Int. Cl.
*G01L 5/00*         (2006.01)
*B24B 49/00*        (2012.01)
(Continued)

(52) U.S. Cl.
CPC ............ *G01L 5/0076* (2013.01); *B24B 49/00* (2013.01); *G01L 1/26* (2013.01); *H01L 21/67092* (2013.01)

(58) Field of Classification Search
CPC ..................................... G01L 5/0076
See application file for complete search history.

(56) References Cited

U.S. PATENT DOCUMENTS 5,054,244 A * 10/1991 Takamatsu ............ B24B 13/015
                                                  451/411
5,868,896 A    2/1999 Robinson et al.
(Continued)

FOREIGN PATENT DOCUMENTS

| CN | 102564649 A | 7/2012 |
|---|---|---|
| CN | 102729136 A | 10/2012 |

(Continued)

OTHER PUBLICATIONS

First Office Action of the Chinese application No. 202011410569.7, issued on Nov. 2, 2022.

(Continued)

*Primary Examiner* — Ryan D Walsh
(74) *Attorney, Agent, or Firm* — Syncoda LLC; Feng Ma

(57) ABSTRACT

A force measurement system includes: a grinding arm and a force receiving device, the force receiving device being fixed on its one side and configured to receive a force from the grinding arm; a load cell, which is fixed on the force receiving device and configured to detect the force received by the force receiving device; and a grinding disk, which is fixed on the grinding arm that applies the force to the force receiving device through the grinding disk. The embodiments of the present application facilitate accurate acquisition of a force acting upon a grinded object during actual grinding.

20 Claims, 3 Drawing Sheets

(51) Int. Cl.
  *G01L 1/26* (2006.01)
  *H01L 21/67* (2006.01)

(56) References Cited

U.S. PATENT DOCUMENTS

| | | | |
|---|---|---|---|
| 5,944,580 A | 8/1999 | Kim et al. | |
| 2009/0318062 A1 | 12/2009 | Chiu et al. | |
| 2013/0052917 A1* | 2/2013 | Park | B24B 37/015 |
| | | | 451/526 |
| 2022/0176515 A1* | 6/2022 | Zhang | B24B 49/10 |

FOREIGN PATENT DOCUMENTS

| | | | | |
|---|---|---|---|---|
| CN | 102802871 A | | 11/2012 | |
| CN | 102950522 A | | 3/2013 | |
| CN | 103144040 A | | 6/2013 | |
| CN | 104354093 A | | 2/2015 | |
| CN | 204546249 U | | 8/2015 | |
| CN | 204868480 U | | 12/2015 | |
| CN | 205271690 U | | 6/2016 | |
| CN | 206415468 U | | 8/2017 | |
| CN | 107902519 A | | 4/2018 | |
| CN | 109202686 A | | 1/2019 | |
| CN | 109794855 A | | 5/2019 | |
| CN | 110024087 A | | 7/2019 | |
| CN | 209774374 U | | 12/2019 | |
| CN | 209868282 U | | 12/2019 | |
| CN | 111055213 A | * | 4/2020 | ........... B24B 37/005 |
| CN | 211728760 U | | 10/2020 | |
| IN | 207696339 U | | 8/2018 | |
| JP | H07290356 A | | 11/1995 | |
| JP | H0938856 A | | 2/1997 | |
| JP | H10118917 A | | 5/1998 | |
| JP | H11333718 A | | 12/1999 | |
| JP | 2002046059 A | | 2/2002 | |

OTHER PUBLICATIONS

China first office action in Application No. 202011414407.0, mailed on Nov. 4, 2022.
International Search Report in Application No. PCT/CN2021/103798, mailed on Sep. 27, 2021.
International Search Report in Application No. PCT/CN2021/107263, mailed on Sep. 18, 2021.
China first office action in Application No. 202011410569.7, mailed on Nov. 2, 2022.

* cited by examiner

FORCE MEASUREMENT SYSTEM AND FORCE MEASUREMENT METHOD

CROSS-REFERENCE TO RELATED APPLICATIONS

This application is a national stage of International Application No. PCT/CN2021/107263 filed on Jul. 20, 2021, which claims priority to Chinese Patent Application No. 202011410569.7 filed on Dec. 3, 2020. The disclosures of these applications are hereby incorporated by reference in their entirety.

TECHNICAL FIELD

Embodiments of the present application relate to the field of semiconductors, and in particular to a force measurement system and a force measurement method.

BACKGRINDED

A chemical mechanical polishing process is to carry out grinding under chemical and mechanical effects. The amount of grinding needs to be controlled during the grinding process. The factors that affect such control include controlling a pressing force of a grinding arm. The magnitude of this pressing force has a direct impact upon a grinding rate and a degree of particle aggregation during the grinding process. It is thus particularly important to precisely control the magnitude of the pressing force.

SUMMARY

Embodiments of the present application provide a force measurement system and a force measurement method, which facilitate accurate acquisition of a force acting upon a grinded object during actual grinding.

To solve the above problem, the embodiments of the present application provides a force measurement system, which includes: a grinding arm and a force receiving device, the force receiving device being fixed on its one side and configured to receive a force from the grinding arm; a load cell, which is fixed on the force receiving device and configured to detect the force received by the force receiving device; and a grinding disk, which is fixed on the grinding arm that applies the force to the force receiving device through the grinding disk.

Accordingly, the embodiments of the present application provide a force measurement method, which includes: providing the force measurement system according to any of the above; setting a pressing force for a grinding arm; controlling the grinding arm to actuate a grinding disk to apply a force to a force receiving device, such that a load cell detects the sum of the pressing force of the grinding arm and the deadweight of the grinding disk.

According to the above technical solution, the load cell is fixed on the force receiving device and, in this way, the grinding disk can be mounted on the grinding arm during force measurement such that the grinding arm applies a force to the force receiving device through the grinding disk. The grinding disk will apply a force, which is equal to its deadweight, to a grinded object during the actual grinding process. Therefore, the detection result from the load cell can be guaranteed to be equal to the actual force acting upon the grinded object during actual grinding only when the detection result from the load cell is the sum of the measured force of the grinding arm and the deadweight of the grinding disk during the force measurement process.

BRIEF DESCRIPTION OF THE DRAWINGS

The exemplary descriptions of one or more embodiments are made by using the corresponding drawings. The figures of the drawings are not shown to scale unless specifically stated.

DETAILED DESCRIPTION

Figure 1:
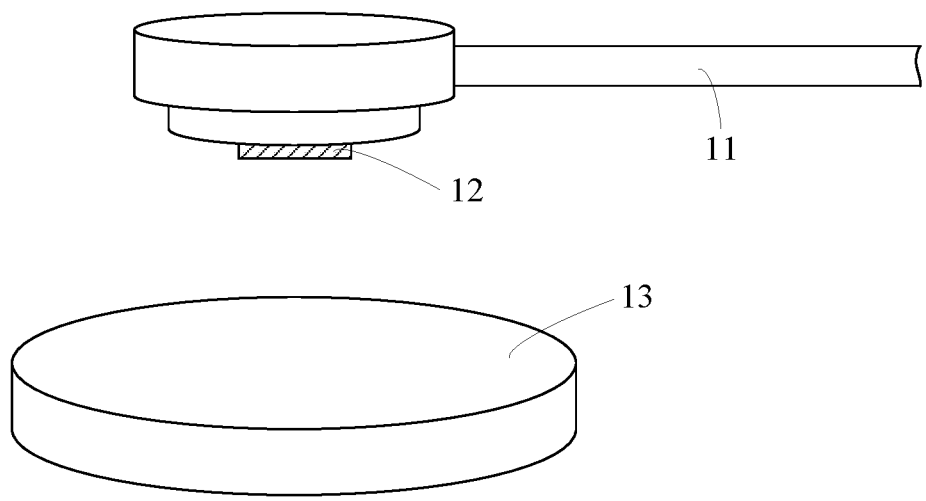
FIG. 1 is a schematic structural diagram of a force measurement system.

FIG. 1 is a schematic structural diagram of a force measurement system.

Referring to FIG. 1, a load cell 12 is mounted on a grinding arm 11. After a pressing force is set by a machine, the grinding arm 11 actuates the load cell 12 to act upon a force receiving device 13. The force receiving device 13 provides a feedback to the load cell 12 via a counter force, such that the load cell 12 acquires the current force of the grinding arm 11.

In a prior art, before the load cell 12 is mounted, a grinding disk mounted on the grinding arm 11, which is required during actual grinding, needs to be removed at first, and then the load cell 12 is mounted on the grinding arm 11 by means of magnetic attraction. At this moment, the force acquired by the load cell 12 only includes the force set by the machine and applied through the grinding arm 11, rather than the deadweight of the grinding disk. As such, the force acquired by the load cell 12 is not the force acting upon the grinded object during actual grinding, and thus the force acting upon the grinded object during actual grinding cannot be accurately monitored and calibrated in accordance with numeral values acquired by the load cell 12.

Also, in order to ensure an effective transmission of the data of the load cell 12, a signal cable on the load cell 12 needs to be connected to a parsing device. The load cell 12 is fixed on the grinding arm 11 and the grinding arm 11 needs to move up and down in actual grinding steps, so the signal cable moves up and down along with the grinding arm 11. Such up-and-down movement may lead to issues in the signal cable, such as internal damage or poor contact, and accordingly, there arises detection data deviations due to internal damage and poor contact.

To solve the above problem, the embodiments of the present application provide a force measurement system. The load cell is fixed on the force receiving device. As such, the grinding disk is mounted on the grinding arm during the force measurement process, such that the grinding arm applies the force to the force receiving device through the grinding disk. During this process, the load cell can measure the sum of the force of the grinding arm and the deadweight of the grinding disk, i.e., the force received by the force receiving device during actual grinding is accurately acquired.

In order to make the objectives, the technical solutions, and the advantages of the embodiments of the present application clearer, the detailed description of the embodiments of the present application is given below in combination with the accompanying drawings. The ordinary skills in the art can understand that many technical details are provided in the embodiments of the present application so as to make the readers better understand the present application. However, even if these technical details are not provided and based on a variety of variations and modifications of the following embodiments, the technical solutions sought for protection in the present application can also be realized.

Figure 2:
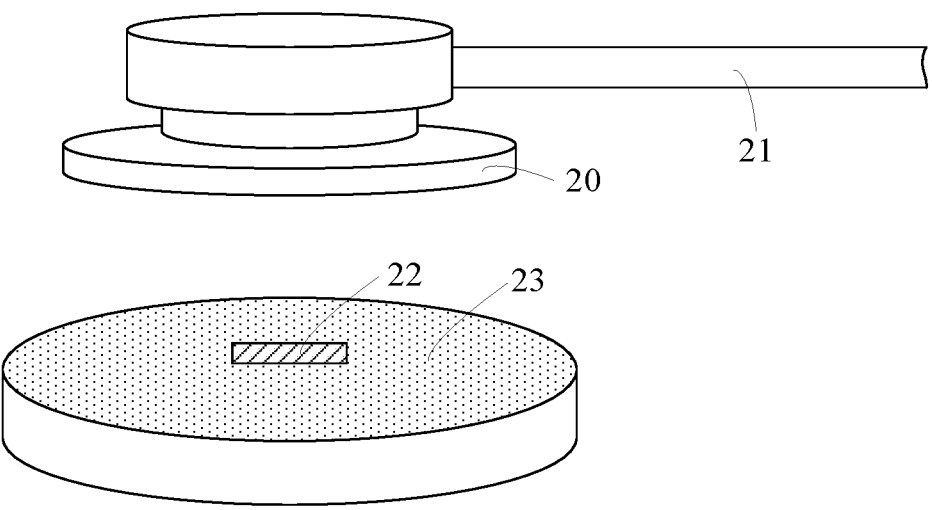
FIG. 2 is a schematic structural diagram of a force measurement system according to embodiments of the present application.
Figure 3:
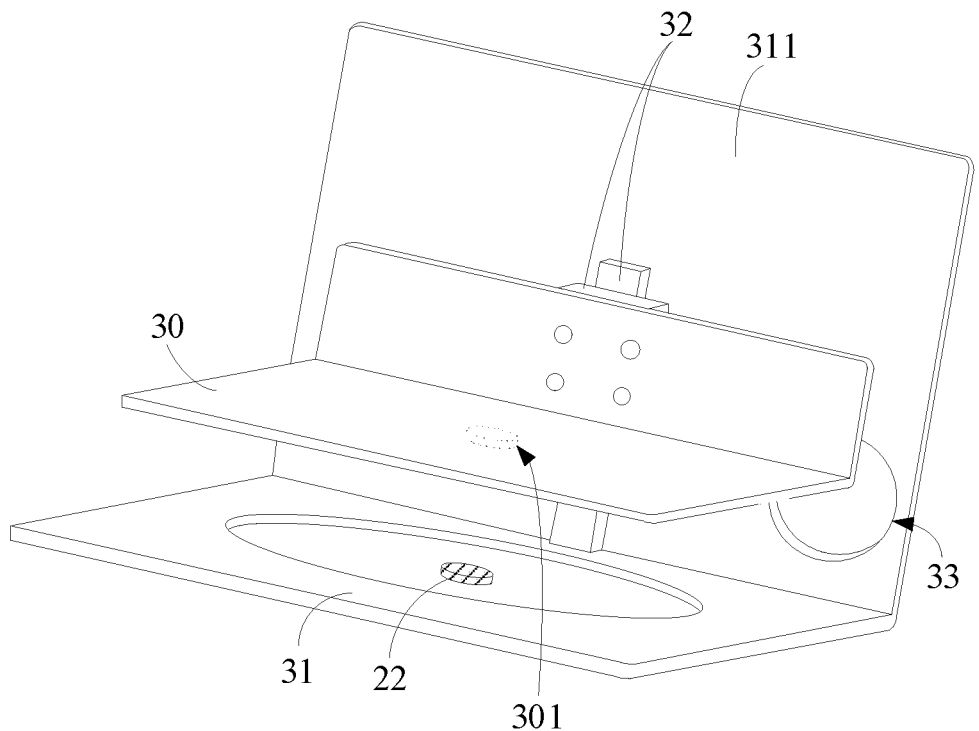
FIG. 3 is a schematic perspective diagram of another force measurement system according to the embodiments of the present application.
Figure 4:
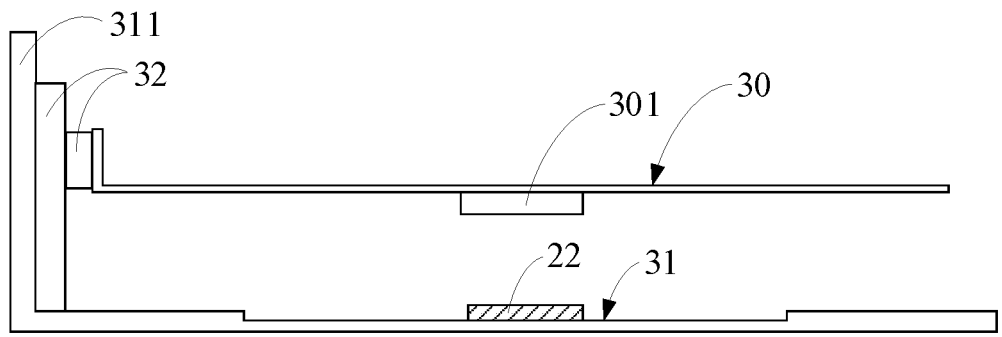
FIG. 4 is a front view of the force measurement system shown in FIG. 3.
Figure 5:
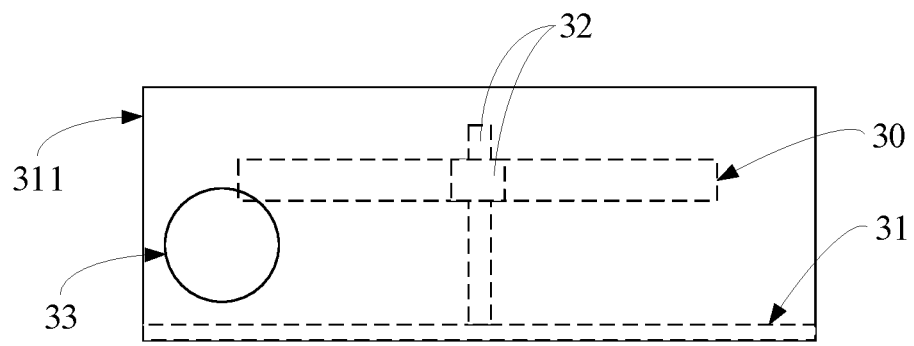
FIG. 5 is a left view of the force measurement system shown in FIG. 3.
Figure 6:
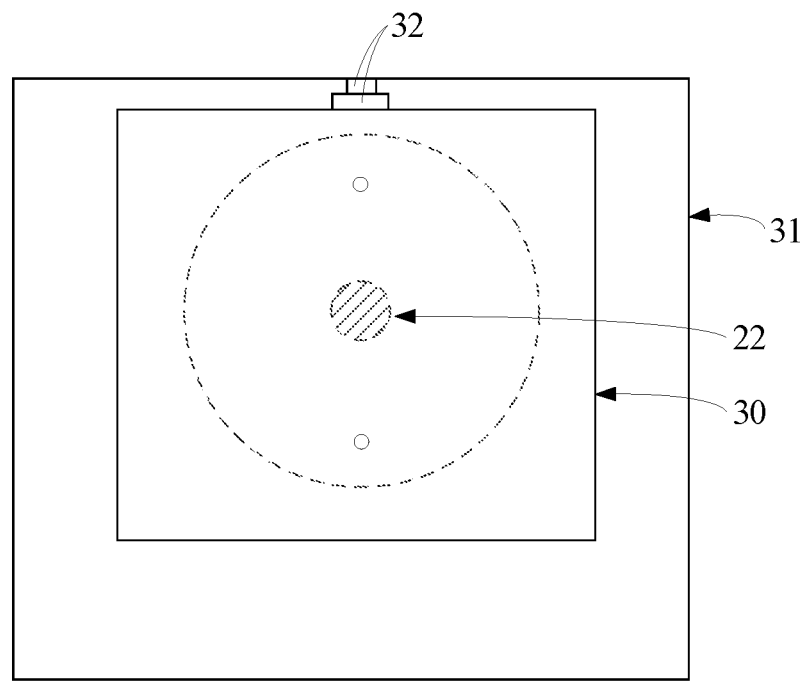
FIG. 6 is a top view of the force measurement system shown in FIG. 3.

FIG. 2 is a schematic structural diagram of a force measurement system according to the embodiments of the present application.

Referring to FIG. 2, the force measurement system includes: a grinding arm 21 and a force receiving device 23, the force receiving device 23 being fixed on its one side and configured to receive a force from the grinding arm 21; a load cell 22, which is fixed on the force receiving device 23 and configured to detect the force received by the force receiving device 23; and a grinding disk 20, which is fixed on the grinding arm 21 that applies the force to the force receiving device 23 through the grinding disk 20.

In this embodiment, a signal cable of the load cell 22 is fixed through a base of the force receiving device 23. Since the base of the force receiving device 23 is unmovable during grinding, fixing the signal cable through the base helps to guarantee that the signal cable has excellent stability and great performances and further that the load cell 22 can accurately acquire the sum of the force of the grinding arm 21 and the deadweight of the grinding disk 20, i.e., the force received by the force receiving device 23 during actual grinding is accurately acquired.

In this embodiment, what the force receiving device 23 actually refers to varies depending on application scenarios. In particular, during the actual grinding process, the force receiving device 23 is generally a grinding table, the grinding arm 21 presses the grinded object onto the grinding table for chemical and mechanical grinding, and the grinded object is generally a wafer. During the test by the force measurement system, the force receiving device 23 may also be a testing structure, i.e., the grinding table is simulated through the testing structure, in order to ensure the accuracy in parameter setting for the grinding device and also superior grinding effect during actual grinding.

An exemplary description will be given below by taking the force receiving device 23 as the testing structure. Details are as follows.

Referring to FIG. 2 to FIG. 6, the force receiving device 23 typically includes a force receiving layer 30 and a base 31. The force receiving layer 30 is configured to receive the force of the grinding arm 21 and the deadweight of the grinding disk 20, and may be bent and deformed when receiving the force. Meanwhile, the force receiving layer 30 may be unsymmetrically bent since it is fixed on its one side. In contrast, the base 31 generally does not change during the force receiving process. When the force receiving device is a grinding table, the force receiving layer is typically a grinding pad.

In this embodiment, the load cell 22 is arranged between the force receiving layer and the base. When the grinding arm 21 applies the force to the force receiving device 23, the force of the grinding device 21 and the deadweight of the grinding disk 20 are transferred to the load cell 22 through the force receiving layer 30. When the load cell 22 comes into contact with the base 31, the base 31 feeds the force back to the load cell 22 in accordance with a counter force, and the load cell 22 acquires the sum of the force of the grinding arm 21 and the deadweight of the grinding disk 20.

Arranging the load cell 22 between the force receiving layer 30 and the base 31 helps avoid the situation where the load cell 22 itself causes interferences to the application of the force receiving layer 30. For example, the force receiving condition of the force receiving layer 30 can be monitored in a continuous and accurate way while a wafer is grinded, and by doing so, the force receiving condition of the force receiving device can be attained in a continuous and accurate way. In other embodiments, the load cell may also be arranged on a side of the force receiving layer away from the base, i.e., located between the force receiving device and the grinding disk.

In this embodiment, the force receiving device 23 further includes a bump 301, the bump 301 is arranged on a surface of the force receiving layer 30 towards the base 31, and the load cell 22 is arranged between the bump 301 and the base 31. By arranging the bump 301, it is beneficial to centralize the force received by the surface of the force receiving layer 30, avoid the situation where the force detected by the load cell 22 is relatively small because the force is dispersed, and further ensure that the numeral values detected by the load cell 22 are accurate.

In this embodiment, the load cell 22 is fixed on the base 31. Since the force receiving layer 30 may be bent and deformed, fixing the load cell 22 on the base 31 helps to ensure a higher precision in the load cell 22. In the meantime, since the base 31 is more stable with respect to the force receiving layer 30, arranging the load cell 22 on the surface of the base 31 helps to further improve the stability and safety of the signal cable of the load cell 22 and guarantee the accuracy of data detected by the load cell 22.

In other embodiments, the load cell may also be fixed on a surface of the bump towards the base.

In this embodiment, when the grinding arm 21 applies the force to the force receiving device 23, the bump 301 comes into contact with the load cell 22, and the load cell 22 performs stress transfer without being bent and deformed. It is avoided that the force receiving layer 30 that is fixed on its one side is unsymmetrically deformed, i.e., such a situation is avoided where the bump 301 only transfers a part of the force onto the load cell 22, or another situation is avoided where the bump 301 transfers, in a centralized way, the force to a particular small area of the load cell 22 to cause damages to the load cell 22. Hence, the accuracy of data detected by the load cell 22 is guaranteed.

In other embodiments, when the grinding arm applies the force to the force receiving device, there is a gap between the bump and the load cell and the force receiving layer transfers the stress to the load cell through bending deformation. It is to be noted that the above bending deformation is preferably elastic deformation, in order to ensure that the testing structure can be reused and the cost for testing is lowered.

In this embodiment, the material of the bump 301 is different from the material of the force receiving layer 30, and the bump 301 is an independent bump that is arranged on a surface of the force receiving layer 30 towards the base 31. In other embodiments, the material of the bump is the same as the material of the force receiving layer, and the bump and the force receiving layer may be integrally formed in one step.

In particular, in this embodiment, the material of the bump 301 has a hardness lower than the material of the force receiving layer 30. As the force receiving layer 30 has a higher hardness, it is beneficial to avoid that the force receiving layer 30 is bent and deformed under a stressed state, and it is thus ensured that the force receiving layer 30 is able to transfer the bending stress to the load cell 22 through the bump 301 in a better way. Meanwhile, as the bump 301 has a lower hardness, it is beneficial to adhere the bump 301 to the surface of the load cell 22 more closely, i.e., the force is transferred to the surface of the load cell 22 more uniformly, thereby avoiding that the load cell 22 is damaged due to its excessively large local force and guaranteeing the accuracy of force data detected by the load cell 22.

In this embodiment, the force receiving device further includes a slide rail 32, the force receiving layer 30 is fixed on its one side by the slide rail 32, and the slide rail 32 is configured to control the force receiving layer 30 to ascend or descend along a direction perpendicular to the surface of the force receiving layer 30. In particular, when the grinding arm 21 has not yet been controlled by the machine to apply the force to the force receiving device, the force receiving layer 30 can be controlled to move towards a direction away from the base 31, so as to fix, repair or replace the load cell 22, or read the detection result of the load cell 22. When the sum of the force applied by the grinding arm 21 and the deadweight of the grinding disk 20 needs to be detected, the force receiving layer 30 can be controlled to move towards a direction close to the base 31, such that the force receiving layer 30 comes into contact with the load cell 22 to transfer the force received by the force receiving layer 30, or such that the spacing between the force receiving layer 30 and the load cell 22 is within a preset value. Thus, it is ensured that the force receiving layer 30 can be bent and deformed to transfer its own received force to the load cell 22.

It is to be noted that a rebound force is generated by bending and deformation of the force receiving layer 30 so as to counteract a part of the force received by the force receiving layer 30, so the force transferred by the bent and deformed force receiving layer 30 is always smaller than the force received by the force receiving layer 30. The force that is counteracted by bending and deformation of the force receiving layer 30 needs to be taken into consideration when setting the above preset value, i.e., the force that is counteracted by bending and deformation needs to be controlled within a preset range, thus guaranteeing the relative accuracy of the force detected by the load cell 22.

Accordingly, the force receiving layer 30 and the load cell 22 are controlled to have a particular spacing therebetween, and this helps avoid the situation where the force receiving layer 30 applies the force to the load cell 22 while moving, i.e., it is ensured that the load cell 22 has an initial value of zero before detecting the sum of the force of the grinding arm 21 and the deadweight of the grinding disk 20.

In other embodiments, prior to force measurement, it is also required that the force receiving layer and the bump are placed on the load cell and the load cell are zeroed to eliminate the impact of the deadweight of the force receiving layer and the deadweight of the bump on the measurement result. The zeroing for the load cell may be manually controlled, and may also be an own special zeroing mode, e.g., automatic zeroing when a particular force is received for a period of time longer than a preset period of time.

It is also to be noted that arrangement of the bump 301 will limit the bending of the force receiving layer 30 so as to decrease the degree of bending and deformation of the force receiving layer 30 while receiving force as well as the magnitude of the rebound force. As a result, the force detected by the load cell 22 is closer to the sum of the deadweights of the grinding arm 21 and the grinding disk 20, and it is further ensured that corresponding calibrations that are made in accordance with the detection values of the load cell 22 can achieve the preset purposes.

In this embodiment, the base 31 further includes a side wall 311 configured to fix the slide rail 32, and the side wall 311 is configured to fix the track of the slide rail 32. It is to be noted that the "base 31" herein is defined as: a component that has no positional change or shape change during actual grinding or during force measurement. As such, only the signal cable of the load cell 22 fixed by the base 31 of the force receiving device 23 has excellent stability and safety.

In particular, the side wall 311 has a cable through hole 33 therein that is configured to fix the signal cable of the load cell 22.

In this embodiment, in a direction perpendicular to the surface of the force receiving layer 30, an orthographic projection of the center of the force receiving layer 30 on the base 31 coincides with an orthographic projection of the center of the load cell 22 on the base 31. This helps to ensure that the force received by the force receiving layer 30 can be effectively transferred to the load cell 22, i.e., it is ensured that the load cell 22 can effectively detect the force received by the force receiving layer 30.

Further, the proportion of the area of the orthographic projection of the load cell 22 and the area of the orthographic projection of the force receiving layer 30 is greater than or equal to 2%. In particular, in the direction perpendicular to the surface of the force receiving layer 30, the orthographic projection of the force receiving layer 30 on the base 31 is a square of 120 mm*120 mm, and the orthographic projection of the load cell 22 on the base 31 is a square of 20 mm*20 mm.

In other embodiments, the orthographic projections of the load cell and the force receiving layer may also be other shapes like round, and also the shape of the orthographic projection of the load cell may be different from the shape of the orthographic projection of the force receiving layer.

In this embodiment, when the load cell 22 comes into contact with the force receiving layer 30 and the base 31, a vertical distance between the surface of the force receiving layer 30 towards the base 31 and the surface of the base 31 towards the force receiving layer 30 is greater than or equal to 0.5 mm. This helps to avoid that the force receiving layer 30 comes into contact with the base 31 since it is bent and deformed, and that the force received by the force receiving layer 30 is directly transferred to other region surfaces of the base 31 such that the counter force fed back to the load cell 22 is decreased. That is, it is ensured that the force detected by the load cell 22 can effectively characterize the sum of the force of the grinding arm 21 and the deadweight of the grinding disk.

In this embodiment, the load cell 22 is located in a groove of the base, the groove has a depth of 1.5 mm, and the bump 31 has a thickness of 2 mm. The materials of the base 31 and the force receiving layer 30 may be aluminum alloy. In the direction perpendicular to the surface of the force receiving layer 30, the force receiving layer 30 has a thickness of 2 mm and the base 31 has a maximum thickness of 3 mm. In addition, the force receiving layer 30 can carry a standard weight in order to take place of the deadweight of the grinding disk 20.

In this embodiment, the load cell is fixed on the force receiving device and, in this way, the grinding disk can be mounted on the grinding arm during force measurement such that the grinding arm applies a force to the force receiving device through the grinding disk. The grinding disk will apply a force, which is equal to its deadweight, to a grinded object during the actual grinding process. Therefore, during actual measurement, the force received by the force receiving device during actual grinding can be accurately obtained only if the load cell is controlled to accurately measure the sum of the force of the grinding arm and the deadweight of the grinding disk.

Accordingly, the embodiments of the present application also provide a force measurement method, which includes: providing the above force measurement system; setting a pressing force for a grinding arm; controlling the grinding arm to actuate a grinding disk to apply a force to a force receiving device, such that a load cell detects the sum of the pressing force of the grinding arm and the deadweight of the grinding disk.

In this embodiment, the grinding arm and the grinding disk act simultaneously upon the force receiving device, the load cell can accurately measure the sum of the force of the grinding arm and the deadweight of the grinding disk, and thus the measurement results from the load cell can be in one-to-one correspondence with the pressing forces set by the grinding arm and can be effectively applied during the actual grinding process. In actual grinding, the pressing forces can be set in accordance with the corresponding relationship between the measurement results and the set pressing forces, such that the grinded object receives the corresponding actual force, and also it is ensured that the preset grinding outcomes are brought to the grinded object.

The ordinary skills in the art can understand that the implementations described above are particular embodiments for implementing the present application. In practical uses, various changes in forms and details may be made to the implementations without departing from the spirit and scope of the present application. Any skills in the art may make their own changes and modifications without departing from the spirit and scope of the present application. Therefore, the protection scope of the present application shall be subject to the protection scope of the claims.

What is claimed is:

1. A force measurement system, comprising:
   a grinding arm and a force receiving device, the force receiving device being fixed on its one side and configured to receive a force from the grinding arm;
   a load cell, which is fixed on the force receiving device and configured to detect the force received by the force receiving device; and
   a grinding disk, which is fixed on the grinding arm that applies the force to the force receiving device through the grinding disk;
   wherein the force receiving device comprises a force receiving layer, a base, and a bump,
   the force receiving layer is fixed on its one side and configured to receive the force from the grinding arm, the bump is arranged on a surface of the force receiving layer towards the base, and the load cell is arranged between the bump and the base.

2. The force measurement system according to claim 1, wherein the load cell is fixed on the base.

3. A force measurement method, comprising:
   providing the force measurement system according to claim 2;
   setting a pressing force for a grinding arm;
   controlling the grinding arm to actuate a grinding disk to apply a force to a force receiving device, such that a load cell detects a sum of the pressing force of the grinding arm and a deadweight of the grinding disk.

4. The force measurement system according to claim 1, wherein the material of the bump has a hardness lower than the material of the force receiving layer.

5. A force measurement method, comprising:
   providing the force measurement system according to claim 4;
   setting a pressing force for a grinding arm;
   controlling the grinding arm to actuate a grinding disk to apply a force to a force receiving device, such that a load cell detects a sum of the pressing force of the grinding arm and a deadweight of the grinding disk.

6. The force measurement system according to claim 1, wherein the force receiving device further comprises a slide rail, the force receiving layer is fixed on its one side by the slide rail, and the slide rail is configured to control the force receiving layer to ascend or descend along a direction perpendicular to the surface of the force receiving layer.

7. A force measurement method, comprising:
   providing the force measurement system according to claim 6;
   setting a pressing force for a grinding arm;
   controlling the grinding arm to actuate a grinding disk to apply a force to a force receiving device, such that a load cell detects a sum of the pressing force of the grinding arm and a deadweight of the grinding disk.

8. The force measurement system according to claim 1, wherein when the load cell comes into contact with the force receiving layer and the base, a vertical distance between the surface of the force receiving layer towards the base and the surface of the base towards the force receiving layer is greater than or equal to 0.5 mm.

9. A force measurement method, comprising:
   providing the force measurement system according to claim 8;
   setting a pressing force for a grinding arm;
   controlling the grinding arm to actuate a grinding disk to apply a force to a force receiving device, such that a load cell detects a sum of the pressing force of the grinding arm and a deadweight of the grinding disk.

10. The force measurement system according to claim 1, wherein in a direction perpendicular to the surface of the force receiving layer, an orthographic projection of the center of the force receiving layer on the base coincides with an orthographic projection of the center of the load cell on the base.

11. The force measurement system according to claim 10, wherein a proportion of an area of the orthographic projection of the load cell and an area of the orthographic projection of the force receiving layer is greater than or equal to 2%.

12. A force measurement method, comprising:
   providing the force measurement system according to claim 11;
   setting a pressing force for a grinding arm;
   controlling the grinding arm to actuate a grinding disk to apply a force to a force receiving device, such that a load cell detects a sum of the pressing force of the grinding arm and a deadweight of the grinding disk.

13. A force measurement method, comprising:
   providing the force measurement system according to claim 10;
   setting a pressing force for a grinding arm;
   controlling the grinding arm to actuate a grinding disk to apply a force to a force receiving device, such that a load cell detects a sum of the pressing force of the grinding arm and a deadweight of the grinding disk.

14. The force measurement system according to claim 1, wherein a signal cable of the load cell is fixed through the base of the force receiving device.

15. A force measurement method, comprising:
providing the force measurement system according to claim 14;
setting a pressing force for a grinding arm;
controlling the grinding arm to actuate a grinding disk to apply a force to a force receiving device, such that a load cell detects a sum of the pressing force of the grinding arm and a deadweight of the grinding disk.

16. A force measurement method, comprising:
providing the force measurement system according to claim 1;
setting a pressing force for a grinding arm;
controlling the grinding arm to actuate a grinding disk to apply a force to a force receiving device, such that a load cell detects a sum of the pressing force of the grinding arm and a deadweight of the grinding disk.

17. A force measurement system, comprising:
a grinding arm and a force receiving device, the force receiving device being fixed on its one side and configured to receive a force from the grinding arm;
a load cell, which is fixed on the force receiving device and configured to detect the force received by the force receiving device; and
a grinding disk, which is fixed on the grinding arm that applies the force to the force receiving device through the grinding disk;
wherein the force receiving device comprises a force receiving layer and a base, the force receiving layer is fixed on its one side and configured to receive the force from the grinding arm, and the load cell is arranged between the force receiving layer and the base;
when the load cell comes into contact with the force receiving layer and the base, a vertical distance between the surface of the force receiving layer towards the base and the surface of the base towards the force receiving layer is greater than or equal to 0.5 mm.

18. A force measurement method, comprising:
providing the force measurement system according to claim 17;
setting a pressing force for a grinding arm;
controlling the grinding arm to actuate a grinding disk to apply a force to a force receiving device, such that a load cell detects a sum of the pressing force of the grinding arm and a deadweight of the grinding disk.

19. A force measurement system, comprising:
a grinding arm and a force receiving device, the force receiving device being fixed on its one side and configured to receive a force from the grinding arm;
a load cell, which is fixed on the force receiving device and configured to detect the force received by the force receiving device; and
a grinding disk, which is fixed on the grinding arm that applies the force to the force receiving device through the grinding disk;
wherein the force receiving device comprises a force receiving layer and a base, the force receiving layer is fixed on its one side and configured to receive the force from the grinding arm, and the load cell is arranged between the force receiving layer and the base;
in a direction perpendicular to the surface of the force receiving layer, an orthographic projection of the center of the force receiving layer on the base coincides with an orthographic projection of the center of the load cell on the base, and a proportion of an area of the orthographic projection of the load cell and an area of the orthographic projection of the force receiving layer is greater than or equal to 2%.

20. A force measurement method, comprising:
providing the force measurement system according to claim 19;
setting a pressing force for a grinding arm;
controlling the grinding arm to actuate a grinding disk to apply a force to a force receiving device, such that a load cell detects a sum of the pressing force of the grinding arm and a deadweight of the grinding disk.

* * * * *